United States Patent [19]

Matsuoka et al.

[11] Patent Number: 4,720,816
[45] Date of Patent: Jan. 19, 1988

[54] PROGRAMMING OF AN EPROM

[75] Inventors: Shigeki Matsuoka, Suita; Satoshi Kono, Toyonaka, both of Japan

[73] Assignee: Ricoh Company, Ltd., Tokyo, Japan

[21] Appl. No.: 829,761

[22] Filed: Feb. 14, 1986

[30] Foreign Application Priority Data

Feb. 15, 1985 [JP] Japan ............................ 60-29143

[51] Int. Cl.⁴ .............................................. G11C 7/00
[52] U.S. Cl. .................................... 365/189; 365/104
[58] Field of Search ............... 365/103, 104, 189, 204, 365/230, 94, 95, 96

[56] References Cited

U.S. PATENT DOCUMENTS

| | | | |
|---|---|---|---|
| 4,388,541 | 6/1983 | Giebel | 365/204 X |
| 4,524,430 | 6/1985 | Page | 365/189 |
| 4,641,285 | 2/1987 | Sasaki et al. | 365/189 X |

Primary Examiner—Joseph A. Popek
Attorney, Agent, or Firm—Cooper, Dunham, Griffin & Moran

[57] ABSTRACT

A system and method for programming an EPROM which includes a bit line, a plurality of memory cell MOS transistors connected to the bit line, a switching transistor for selectively applying a programming voltage to the bit line, and a selection circuit for selecting one of the memory transistors for programming. In accordance with the principle of the present invention, when one of the memory transistors is selected for programming, the programming voltage is applied to the bit line and thus to the drain of the selected memory transistor and to the gate of the selected memory transistor. Then, even after termination of application of the programming voltage to the bit line, the programming voltage remains to be applied to the gate for a predetermined time period, thereby allowing charge stored in the parasitic capacitance of the bit line to be completely discharged through the selected transistor.

10 Claims, 7 Drawing Figures

PROGRAMMING OF AN EPROM

BACKGROUND OF THE INVENTION

1. Field of the Invention

This invention relates to a technique for programming a semiconductor memory device, and, in particular, to a programming system and method of an erasable programmable read only memory (EPROM).

2. Description of the Prior Art

A typical prior art EPROM structured around a single bit line is shown in FIG. 6. As is well known in the art, a plurality of memory cell transistors, such as FAMOSs or stacked-gate MOSs, M1, M2, ..., have their drains connected to a bit line B, which is connectable to a programming high voltage $V_{pp}$ through a switching N-channel MOS transistor Q1. For example, upon completion of programming of the memory cell transistor M1, when the memory cell transistor M1 is set in a deselected state and another memory cell transistor M2 is set in a selected state, if the charge applied in the previous programming step still remains in the parasitic capacitance of the bit line B, the memory cell transistor M2 will be programmed unconditionally. In order to avoid this situation, a discharging N-channel MOS transistor Q2 is provided as connected to the bit line B so as to remove the charge prior to each programming step.

The on/off operation of the discharging transistor Q2 is controlled by a control signal N6. This control signal N6 is supplied through a buffer circuit C3 as an output signal of a two-input NOR gate N, which has one of its two input terminals connected to receive a signal SVP of the same polarity as that of a control signal N2 to be applied to the gate of the switching transistor Q1 and its other input terminal connected to receive a signal output from a timing generating circuit C1 when the signal SVP is applied to a signal level converting circuit C2 which is connected to the timing generating circuit C1. The signal SVP is converted to the programming voltage $V_{pp}$ by the signal level converting circuit C2. The timing generating circuit C1 is basically comprised of a one-shot circuit.

With reference to a timing chart shown in FIG. 7, the operation of programming the above-described prior art EPROM will be described. When the control signal N2 applied to the gate of the switching transistor Q1 and a selection signal N41 applied to the gate of the memory cell transistor M1 are set at the programming voltage $V_{pp}$, programming is effected to the memory cell transistor M1. During this programming period, if the signal SVP becomes a high level or $V_{cc}$ level, the signal level converting circuit C2 supplies a $V_{pp}$ level output signal which is then supplied to the timing generating circuit C1, in which its N-channel MOS transistor Q3 is turned on and its N-channel MOS transistor Q4 is turned off so that a capacitor C comprised of a MOS transistor is charged through the transistor Q3. Since either of the two input signals to the NOR gate N is at high level until the programming is completed, the voltage at the gate of the discharging transistor Q2 remains at low level (ground GND level in the illustrated example) so that the transistor Q2 is maintained off.

Then, when the signal N2 changes from $V_{pp}$ level to low level and the signal N41 changes from $V_{pp}$ level to high level to complete the programming operation and at the same time when the signal SVP changes from high level to low level, both of the two input signals to the NOR gate N become low level to cause the signal N6 to become high level, so that the transistor Q2 is turned on, thereby discharging the charge stored in the parasitic capacitance of the bit line B (cf. N3 in FIG. 7). Then, at the timing generating circuit C1, the transistor Q3 is turned off and the transistor Q4 is turned on, so that the charge stored in the capacitor C is discharged through the transistor Q4. During this discharging process, when the voltage of the capacitor C becomes lower than the threshold voltage of an inverter I1 after a predetermined time period, one of the input signals to the NOR gate N becomes high level so that the signal N6 to be applied to the gate of the discharging transistor Q2 again becomes low level. This completes the programming operation of the single memory cell transistor M1.

However, in accordance with such a prior art programming method, it is required to provide not only the discharging transistor Q2 for each bit line B, but also a buffer circuit for driving the gate of the discharging transistor Q2. As a result, these elements make it harder to make an EPROM smaller in size or higher in density.

SUMMARY OF THE INVENTION

In accordance with the present invention, in order to program a selected memory MOS transistor having a gate and a pair of drain/source regions, a programming voltage $V_{pp}$ is applied to its gate and also to one of its pair of drain/source regions. And, then, even after termination of the application of the programming voltage $V_{pp}$ to the drain/source region, the programming voltage $V_{pp}$ remains to be applied to the gate for a predetermined time period, thereby allowing the charge stored in the parasitic capacitance of a bit line to be discharged through the selected memory transistor. With such a structure, there is no need to provide the discharging transistor Q2 and its associated buffer circuit C3 which are required in the prior art structure shown in FIG. 6.

It is therefore a primary object of the present invention to obviate the disadvantages of the prior art as described above and to provide an improved system and method for programming an EPROM.

Another object of the present invention is to provide an improved system and method for programming an EPROM which allows one to make an EPROM smaller in size for a given density or higher in density for a given area.

A further object of the present invention is to provide an improved system and method for programming an EPROM simpler in structure, and thus easy and inexpensive to manufacture.

Other objects, advantages and novel features of the present invention will become apparent from the following detailed description of the invention when considered in conjunction with the accompanying drawings.

DESCRIPTION OF THE PREFERRED EMBODIMENTS

Figure 1:
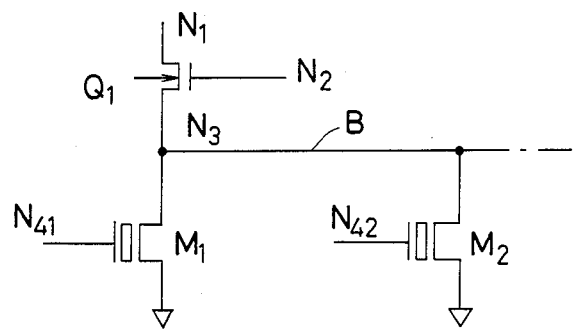
FIG. 1 is a circuit diagram showing the main portion of an EPROM to which the present invention may be advantageously applied.
Figure 2:
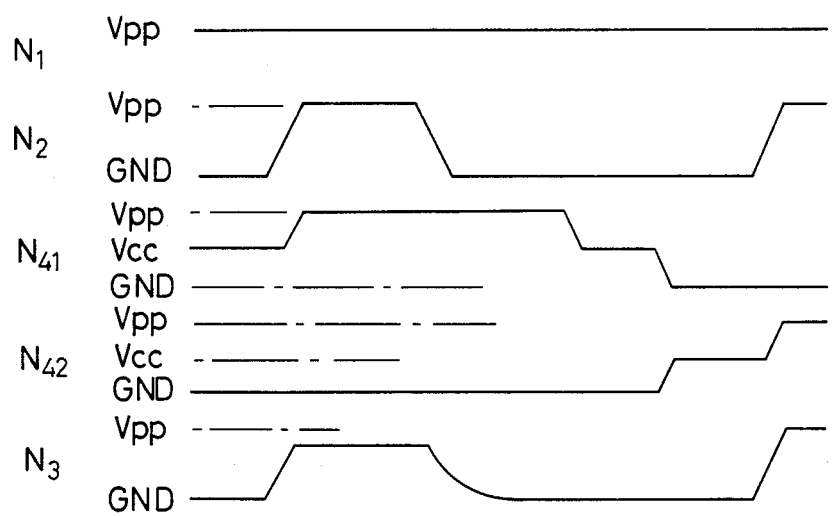
FIG. 2 is a timing chart which is useful for explaining the principle of operation of the present invention.

Referring now to FIGS. 1 and 2, in an EPROM constructed in accordance with the principle of the present invention, there are provided a plurality of memory cell MOS transistors M1, M2, . . . which have their drain regions connected to a common bit line B, to which a programming voltage $V_{pp}$ may be applied through a switching MOS transistor Q1. Of importance, as different from the prior art structure, there is provided no discharging MOS transistor as connected to the bit line B.

When the programming operation is to be carried out, for example, if the memory cell transistor M1 is selected, a gate voltage N41 applied to the gate of the transistor M1 is set at programming level $V_{pp}$ and the switching transistor Q1 connected to the bit line B is turned on to apply the programming voltage also to the drain region of the selected transistor M1, so that the selected transistor M1 is programmed. Then, even after rendering the switching transistor Q1 to be turned off, the gate voltage N41 applied to the gate of the memory cell transistor M1 remains at the programming level $V_{pp}$ for a predetermined time period, thereby allowing the charge stored in the parasitic capacitance of the bit line B to be discharged through the selected memory cell transistor M1. Thereafter, the gate voltage N41 of the memory cell transistor M1 is returned to high level and the memory cell transistor M1 is set in a deselected state. And, then, another memory cell transistor, for example transistor M2, is selected for programming.

Figure 3:
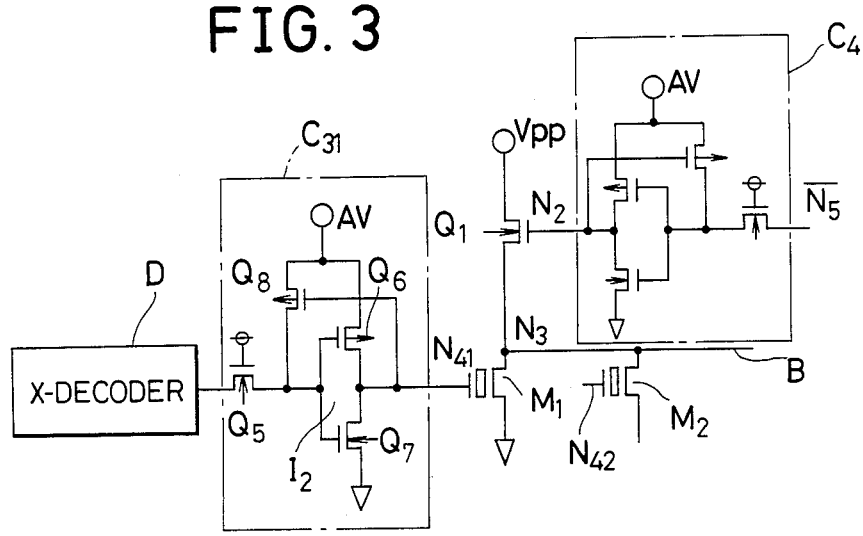
FIGS. 3 and 4 are circuit diagrams showing an EPROM constructed in accordance with one embodiment of the present invention.
Figure 4:
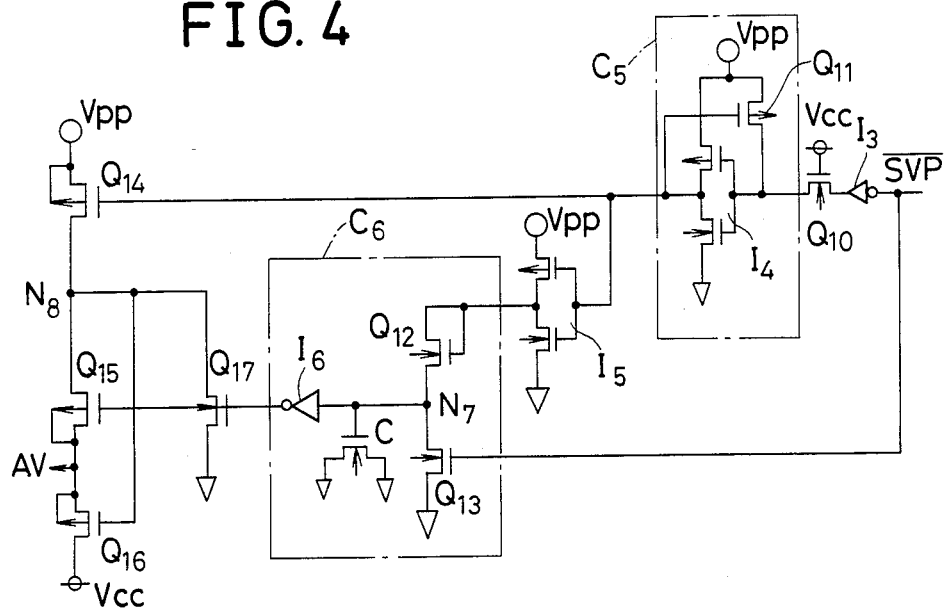

FIGS. 3 and 4 show a more specific EPROM constructed in accordance with one embodiment of the present invention. FIG. 3 schematically shows the structure around a single bit line B. As shown, a plurality of memory cell transistors M1, M2, . . . are provided with their drain regions connected to the common bit line B, and each of the memory cell transistors M1, M2, . . . has its gate connected to a X-decoder D through an individual driver circuit (e.g., C31 for the memory cell transistor M1). Also provided is a switching MOS transistor Q1 as connected between the bit line B and a source of programming voltage $V_{pp}$ so that the programming voltage $V_{pp}$ is controllably applied to the bit line B through the transistor Q1, which has its gate connected to a driver circuit C4 structurally the same as the driver circuit C31. A programming voltage signal N5 is supplied to the driver circuit C4.

The driver circuits C31 and C4 are connected to receive a supply voltage AV which is produced by the circuit shown in FIG. 4 and which can be either $V_{pp}$ level or high level. Since both of the driver circuits C31 and C4 are the same in structure, the following description will be made only on circuit C31. The driver circuit C31 includes an input terminal which is connected to an inverter circuit I2 through a reverse current preventing transistor Q5. The inverter circuit I2 is comprised of a pair of transistors including a P-channel MOS transistor Q6 having its source region connected to a terminal of supply voltage AV and an N-channel MOS transistor Q7 having its source region connected to ground. The drain region of the transistor Q6 and the drain region of the transistor Q7 are commonly connected to define an output terminal of the driver circuit C31. Also provided in the driver circuit C31 is a P-channel MOS transistor Q8 which has its source region connected to the supply voltage AV, its drain region connected to the input terminal of the inverter circuit I2, and its gate connected to the output terminal of the inverter circuit I2.

As will be appreciated, both of the driver circuits C31 and C4 function to supply output signals of AV level or low level in response to input signals low level or high level, respectively.

FIG. 4 shows a circuit for producing the supply voltage AV to be applied to the driver circuits C31 and C4, and this circuit is commonly used for the driver circuits C31 and C4 of each bit line. The structure shown in FIG. 4 includes a signal level converting circuit C5 which includes a CMOS inverter circuit I4 connected between the programming voltage $V_{pp}$ and ground and a P-channel MOS transistor Q11 which is connected between the programming voltage $V_{pp}$ and the input terminal of the inverter circuit I4 and which has its gate connected to the output terminal of the inverter circuit I4. Thus, the level converting circuit C5 functions to convert an input signal of low level or high level to $V_{pp}$ level or low level, respectively. To the input terminal of the level converting circuit C5 is applied a programming signal $\overline{SVP}$ same in polarity as the programming signal N5 shown in FIG. 3 through an inverter I3 and a reverse current preventing transistor Q10.

Figure 6:
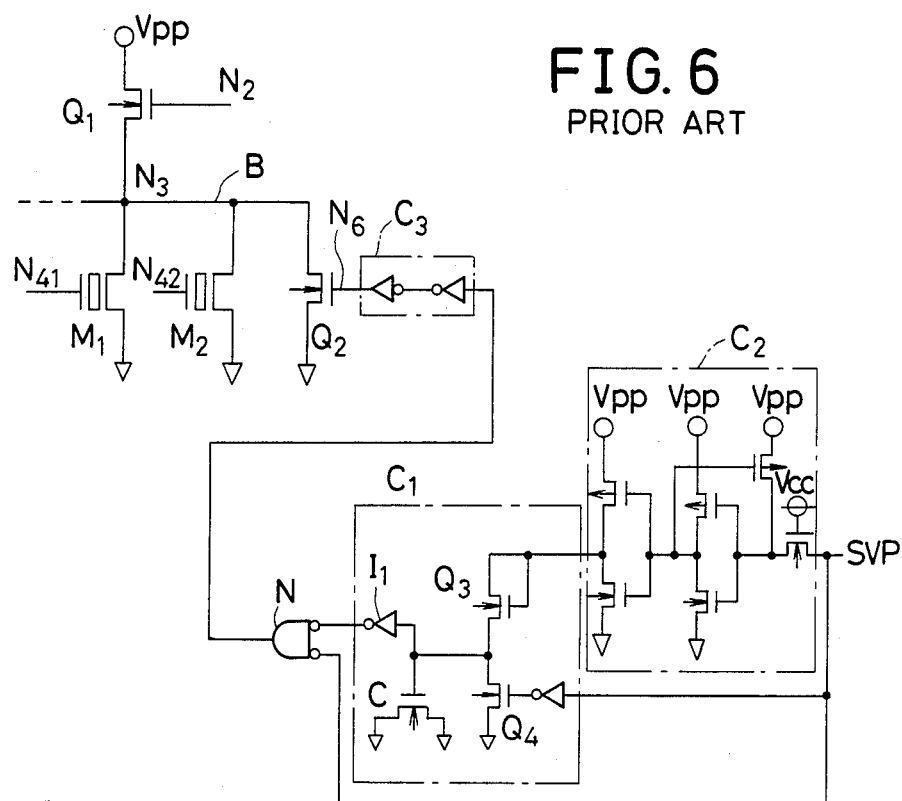
FIG. 6 is a circuit diagram showing a typical prior art EPROM.
Figure 7:
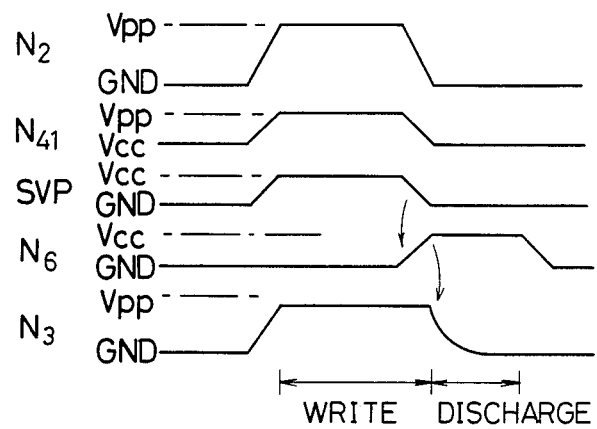
FIG. 7 is a timing chart which is useful for explaining the programming operation of the EPROM shown in FIG. 6.

The structure of FIG. 4 also includes a timing generating circuit C6 which is basically comprised of a one-shot circuit and similar in structure to the timing generating circuit C1 shown in FIG. 6. The timing generating circuit C6 includes a pair of N-channel MOS transistors Q12 and Q13 and a capacitor C comprised of a MOS transistor and connected between a node N7, between the transistors Q12 and Q13, and ground. The timing generating circuit C6 also includes an inverter I6 which is connected between the node N7 and an output terminal of the circuit C6. The transistor Q12 has its drain region connected to its gate and also to receive an output signal from the level converting circuit C5 through a CMOS inverter circuit I5 connected between programming voltage $V_{pp}$ and ground terminals. The transistor Q13 has its gate connected to receive the programming signal $\overline{SVP}$.

Also provided in the structure shown in FIG. 4 are P-channel MOS transistors Q14, Q15, and Q16 which are connected in series between the programming voltage $V_{pp}$ and the high level voltage Vcc. The transistor Q14 has its gate connected to receive an output signal from the level converting circuit C5, the transistor Q15 has its gate connected to receive an output signal from the timing generating circuit C6, and the transistor Q16 has its gate connected to a node N8 between the transistors Q14 and Q15. To the node N8 is also connected the drain of the N-channel MOS transistor Q17 which has its source connected to ground and its gate connected to receive an output signal from the timing generating circuit C6. An interconnection between the transistors Q15 and Q16 is defined as an output terminal for supplying the supply voltage AV.

Figure 5:
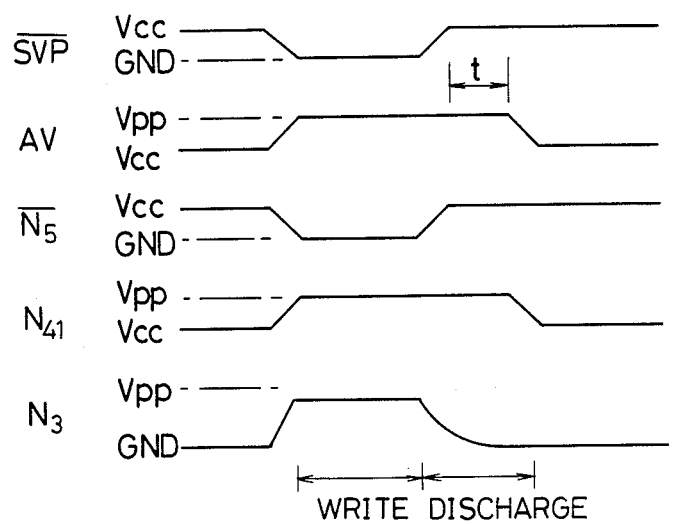
FIG. 5 is a timing chart which is useful for explaining the operation of the EPROM shown in FIGS. 3 and 4.

Now, also referring to FIG. 5, the programming operation of this embodiment of EPROM will be described below. Let us assume that the memory cell transistor M1 has been selected for programming. When the programming signals N5 and $\overline{SVP}$ are set at low level, the output signal of the level converting circuit C5 shown in FIG. 4 becomes low level to have the transistor Q14 turned on, and, at the same time, the output signal of the timing generating circuit C6 also becomes low level to have the transistor Q15 turned on, the transistor Q17 turned off and the transistor Q16 turned off, so that the supply voltage AV becomes the programming level $V_{pp}$. For this reason, in FIG. 3, the gate of the memory cell transistor M1 selected by the X-decoder D becomes the programming level $V_{pp}$, and, at the same time, the switching transistor Q1 is also turned on to cause the drain of the memory cell transistor M1 to become the programming level $V_{pp}$, so that programming is effected to the selected memory cell transistor M1.

Then, when the programming signals N5 and $\overline{SVP}$ are changed to high level, the switching transistor Q1 shown in FIG. 3 turns off in the first place. And, in the timing generating circuit C6 shown in FIG. 4, the transistor Q12 is turned off and the transistor Q13 is turned on, so that the charge stored in the capacitor C during the programming period is discharged through the transistor Q13; however, the output signal of the timing generating circuit C6 remains unchanged until the voltage at the node N7 has dropped to the threshold voltage of the inverter I6. Then, when the voltage at the node N7 of the timing generating circuit C6 has dropped to the threshold voltage of the inverter I6, the transistor Q15 is turned off, the transistor Q17 is turned on, and the transistor Q16 is turned on, thereby causing the supply voltage AV to become high level ($V_{cc}$). During this delay time period t from a point in time when the programming signals N5 and $\overline{SVP}$ have been changed from low level to high level to a point in time when the supply voltage AV has changed from $V_{pp}$ level to high level, the memory cell transistor M1 remains in a selected state, and since the gate voltage N41 is at $V_{pp}$ level and the switching transistor Q1 is turned off, the charge stored in the parasitic capacitance of the bit line B is discharged through the selected memory cell transistor M1 as shown in N3 in FIG. 5. Thereafter, the memory cell transistor M1 is set in a deselected state by the X-decoder D. Then, after selecting another memory cell transistor, for example M2, the operation similar to the one described above is repeated to carry out programming to this newly selected memory cell transistor.

The delay time period t in the above-described embodiment may be arbitrarily set according to the capacitance of the capacitor C and the transconductance gm of the transistor Q13 provided in the timing generating circuit C6 shown in FIG. 4. This delay time period t necessary for carrying out the discharging of the bit line B through a selected memory cell transistor should satisfy the condition that $V \cdot \exp(-t/rc)$ is less than or equal to Vw, wherein r is an impedance of a single memory cell transistor, c is a parasitic capacitance of bit line B, V is a voltage stored on bit line B, and Vw is a programming start voltage of the memory cell transistor. Accordingly, it is only necessary to design such that the transistor forming the capacitor C and the transistor Q13 provided in the timing generating circuit C6 satisfy the above-described condition.

As dicussed above, in accordance with the present invention, since the charge stored in the parasitic capacitance during programming to a selected memory cell transistor is discharged through the same transistor immediately following the programming period, there is no need to provide the discharging transistor Q2 and its associated buffer circuit C3. As a result, the principle of the present invention reduces the number of elements needed in an EPROM, thereby reducing the size of an EPROM for a given density or to increase the density for given size.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A system for programming an EPROM including at least one bit line having a parasitic capacitance and a plurality of memory cell MOS transistors each having a gate and a pair of source/drain regions one of which is commonly connected to said bit line, said system comprising:

switching means responsive to a first control signal for connecting a programming voltage to said bit line for a first predetermined time period for carrying out programming of a selected MOS transistor; and applying means for selectively applying said programming voltage to a selected one of said plurality of memory cell MOS transistors for said first predetermined time period, to thereby cause a charge to be stored in said parasitic capacitance of said bit line, and for a second predetermined time period immediately following said first predetermined time period, to thereby cause said charge stored in said parasitic capacitance of said bit line during said first predetermined time period to be discharged through said selected one of said plurality of memory cell MOS transistors during said second predetermined time period.

2. The system of claim 1 wherein said applying means includes an X-decoder and a plurality of first driver circuits each connected between said X-decoder and the corresponding one of said plurality of memory cell MOS transistors, each of said first driver circuits receiving a supply voltage whose level changes between first and second levels in accordance with the state of a second control signal.

3. The system of claim 2 wherein said first level is at the level of said programming voltage and said second level is at a higher level voltage.

4. The system of claim 3 further comprising a second driver circuit connected to said switching means, whereby said first control signal is supplied to said switching means through said second driver circuit.

5. The system of claim 4 wherein said first and second driver circuits are identical in structure.

6. The system of claim 5 wherein each of said first and second driver circuits includes a CMOS inverter having an input terminal and output terminal and connected between said supply voltage and a reference voltage, and a first conductivity MOS transistor having its first source/drain region connected to said supply voltage, its second drain/source region connected to the input terminal of samd CMOS inverter and its gate connected to the output terminal of said CMOS inverter.

7. The system of claim 6 wherein each of said first and second driver circuits further comprises a second conductivity MOS transistor which is connected between said input terminal of said CMOS inverter and an input terminal of said driver circuit and which has its gate connected to said high level voltage.

8. The system of claim 1 wherein said switching means includes a MOS transistor having its first source/drain region connected to said programming voltage, its second source/drain region connected to said bit line, and its gate connected to receive said first control signal.

9. A method for programming an EPROM including at least one bit line having a parasitic capacitance, a plurality of memory cell MOS transistors each of which has a drain, a source, and a gate and has its drain commonly connected to said bit line, a switching transistor for selectively applying a first predetermined voltage to said bit line, and selecting means for selecting one of said plurality of memory cell MOS transistors for programming, said method comprising the steps of:

selecting one of said plurality of memory cell MOS transistors by applying a second predetermined voltage to the gate of said selected transistor while at the same time applying said first predetermined voltage to said bit line through said switching transistor, to thereby carry out programming of said selected transistor, wherein a charge is stored in said parasitic capacitance of said bit line; and continuously applying said second predetermined voltage to the gate of said selected transistor for a predetermined time period after termination of application of said first predetermined voltage to said bit line through said switching transistor, to thereby allow said charge stored in said parasitic capacitance of said bit line to be discharged through said selected transistor during said predetermined time period.

10. The method of claim 9 wherein said first and second predetermined voltages are at the same level.

* * * * *